United States Patent
Guo et al.

(10) Patent No.: US 10,508,221 B2
(45) Date of Patent: Dec. 17, 2019

(54) AQUEOUS LOW ABRASIVE SILICA SLURRY AND AMINE CARBOXYLIC ACID COMPOSITIONS FOR USE IN SHALLOW TRENCH ISOLATION AND METHODS OF MAKING AND USING THEM

(71) Applicant: Rohm and Haas Electronic Materials CMP Holdings, Inc., Newark, DE (US)

(72) Inventors: Yi Guo, Newark, DE (US); David Mosley, Lafayette Hill, PA (US); Naresh Kumar Penta, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/718,998

(22) Filed: Sep. 28, 2017

(65) Prior Publication Data

US 2019/0092970 A1 Mar. 28, 2019

(51) Int. Cl.
*C09G 1/02* (2006.01)
*H01L 21/762* (2006.01)
*H01L 21/3105* (2006.01)
*C09K 3/14* (2006.01)

(52) U.S. Cl.
CPC .............. *C09G 1/02* (2013.01); *C09K 3/1463* (2013.01); *H01L 21/31053* (2013.01); *H01L 21/76224* (2013.01)

(58) Field of Classification Search
CPC .... C09G 1/02; C09K 3/1463; H01L 21/31053
See application file for complete search history.

(56) References Cited

U.S. PATENT DOCUMENTS

| | | |
|---|---|---|
| 7,217,989 B2 | 5/2007 | Hiramitsu et al. |
| 7,316,603 B2 | 1/2008 | Carter et al. |
| 7,531,105 B2 | 5/2009 | Dysard et al. |
| 7,846,842 B2 | 12/2010 | Carter et al. |
| 8,419,970 B2 | 4/2013 | Kamimura |
| 8,492,277 B2 | 7/2013 | Guo et al. |
| 8,529,787 B2 | 9/2013 | Higuchi et al. |
| 8,691,695 B2 | 4/2014 | Moeggenborg et al. |
| 8,759,216 B2 | 6/2014 | Dysard et al. |
| 8,778,212 B2 | 7/2014 | Jin et al. |
| 9,028,572 B2 | 5/2015 | Grumbine et al. |
| 9,238,753 B2 | 1/2016 | Reiss et al. |
| 9,499,721 B2 | 11/2016 | Grumbine et al. |
| 9,631,122 B1 | 4/2017 | Dockery et al. |
| 9,803,108 B1 * | 10/2017 | Guo .................... B24B 1/00 |
| 2012/0070990 A1 * | 3/2012 | Liu .................... H01L 21/31053 438/693 |
| 2015/0376458 A1 | 12/2015 | Grumbine et al. |
| 2015/0376463 A1 * | 12/2015 | Fu .................... C09G 1/02 438/693 |

* cited by examiner

*Primary Examiner* — Duy Vu N Deo
(74) *Attorney, Agent, or Firm* — Andrew Merriam; John J. Piskorski

(57) ABSTRACT

The present invention provides aqueous chemical mechanical planarization (CMP) polishing compositions comprising one or more dispersions of colloidal silica particles having a zeta potential of from +5 to +50 mV and having one or more aminosilane group, preferably, elongated, bent or nodular colloidal silica particles, or, more preferably, such particles which contain a cationic nitrogen atom, and at least one amine heterocycle carboxylic acid having an isolectric point (pI) of from 2.5 to 5, preferably, from 3 to 4. The compositions have a pH of from 2.5 to 5.3. Preferably, the amine heterocycle carboxylic acid is an amine-containing heterocyclic monocarboxylic acid, such as nicotinic acid, picolinic acid, or isonicotinic acid. The compositions enable enhanced oxide:nitride removal rate ratios.

8 Claims, No Drawings

AQUEOUS LOW ABRASIVE SILICA SLURRY AND AMINE CARBOXYLIC ACID COMPOSITIONS FOR USE IN SHALLOW TRENCH ISOLATION AND METHODS OF MAKING AND USING THEM

The present invention relates to aqueous chemical mechanical planarization (CMP) polishing compositions comprising an abrasive of one or more dispersions of colloidal silica particles having one or more aminosilane group, wherein the one or more dispersions of colloidal silica particles has a zeta potential of from +5 to +50 mV, or preferably, from +10 to +30 mV at the pH of the composition, and at least one amine heterocycle carboxylic acid having an isolectric point (pI) of from 2.5 to 5, the compositions having a pH of from 2.5 to 5.3.

In front-end-of-line (FEOL) semiconductor processing, shallow trench isolation (STI) is critical to the formation of gates in integrated circuit fabrication, such as prior to formation of the transistors. In STI, a dielectric such as tetraethyl orthosilicate (TEOS) or silicon dioxide is deposited in excess in openings formed in the silicon wafer, for example, a trench or isolation area which is isolated from the remainder of the integrated circuit by silicon nitride (SiN) barrier. A CMP process is then used to remove the excess dielectric, resulting in a structure in which a predetermined pattern of the dielectric is inlaid in the silicon wafer. CMP for STI requires the removal and planarization of the silicon dioxide overburden from the isolation areas, thereby resulting in a coplanar surface with the silicon dioxide-filled trenches. In STI, the silicon nitride film surfaces must be cleared of the silicon dioxide or oxide to allow subsequent removal of the nitride hard mask in downstream processing. An acceptable oxide:nitride removal rate ratio is necessary to prevent damage to the underlying Si active areas and provide an overpolish margin to ensure all pattern densities are cleared of the oxide. Further, dishing of the oxide in any trench must be avoided to prevent low threshold voltage leaks in finished gates.

Presently, users of aqueous chemical, mechanical planarization polishing (CMP polishing) compositions used with CMP polishing pads to polish substrates wish to avoid the use of ceria containing CMP polishing compositions. Ceria slurries show high selectivity for silicon dioxide over silicon nitride and avoid removal of oxide in the trench area upon exposure of silicon nitride, but are costly, have issues with RR and process stability, and are prone to causing defects during polishing. Silica slurry formulations offer lower cost, lower defect solutions, but, to date, have suffered from inadequate oxide:nitride selectivity for use in STI applications. The silica particles with aminosilane-surface treatment recently showed some promise as it exhibits relatively high oxide rate and significantly reduced nitride rate thanks to favorable particle/wafer electrostatic repulsion. Such aqueous silica slurry CMP compositions perform optimally for oxide rate at a pH range of 4 to 5.5 wherein nitride rate remains challenging to match with what ceria particle provides. To stabilize the pH during that pH regime, a type of carboxylic acid is often used as titrate and/or buffer agent, such acetic acid and citric acid. Such compounds are inadequate to provide desirable nitride suppression and thus there is a need to identify new type of chemical additives to achieve improved oxide:nitride selectivity.

U.S. Pat. No. 9,499,721B2, to Grumbine et al. discloses a chemical mechanical polishing composition for polishing a substrate, the composition comprising a colloidal silica dispersion which may have particles with a permanent positive charge and one or more chemical species incorporated into the particles. The chemical species in the silica particles can be a nitrogen containing compound, preferably, an aminosilane, or a phosphorous containing compound. Of the many hundreds of such chemical species of the nitrogen disclosed, however, Grumbine fails to disclose any composition in which any amine carboxylic acid increases the selectivity of dielectric oxide:dielectric nitride removal rates.

The present inventors have endeavored to solve the problem of providing aqueous silica slurries which enable acceptable oxide dishing control and oxide:nitride removal rate selectivity for use in STI applications.

STATEMENT OF THE INVENTION

1. In accordance with the present invention, aqueous chemical mechanical planarization (CMP) polishing compositions comprising an abrasive of one or more dispersions of colloidal silica particles having one or more aminosilane group, preferably, of elongated, bent or nodular colloidal silica particles or their mixture with one or more dispersions of spherical colloidal silica particles, wherein the one or more dispersions of a plurality colloidal silica particles has a zeta potential of from +5 to +50 mV, or preferably, from +10 to +30 mV at the pH of the composition, and at least one amine heterocycle carboxylic acid having an isoelectric point (pI) of from 2.5 to 5, or, preferably, from 3 to 4.5, the compositions having a pH of from 2.5 to 5.3, or, preferably, from 4 to 5 and, further wherein, the amount of the abrasive particles as solids, ranges from 0.01 to 20 wt. %, or, preferably, from 0.1 to 15 wt. %, or, more preferably, from 0.5 to 3 wt. %, based on the total weight of the composition. The CMP polishing compositions may be stored and shipped as a concentrate and then diluted with water at the time of polishing the substrate.

2. In accordance with the aqueous CMP polishing compositions as set forth in item 1, above, wherein the abrasive comprises a mixture of a dispersion of elongated, bent or nodular colloidal silica particles which contain a cationic nitrogen atom, or a mixture thereof with a dispersion of a plurality of spherical colloidal silica particles, wherein the amount of the dispersion of the elongated, bent or nodular colloidal silica particles ranges from 50 to 99.9 wt. %, or, preferably, from 65 to 99.9 wt. %, based on the total solids weight of the abrasive.

3. In accordance with the aqueous CMP polishing compositions as set forth in any one of items 1 or 2, above, wherein the abrasive comprises at least one dispersion of elongated, bent or nodular colloidal silica particles that has an average particle aspect ratio of the longest dimension of the particle to its diameter which is perpendicular to the longest dimension of from 1.8:1 to 3:1.

4. In accordance with the aqueous CMP polishing compositions as in any one of items 1, 2, or 3, above, wherein at least one of or all of the dispersions of colloidal silica particles comprises one or more nitrogen atoms inside the particle whereby the particle exhibits a positive surface charge or zeta potential in the absence of any aminosilane group; for example, the nitrogen trapped inside the colloidal silica particles may be from any of alkylammonium hydroxide, alkylamine, alkoxyalkyl amine, alkoxyalkyl ammonium hydroxide, arylamine or aryl ammonium hydroxide.

5. In accordance with the aqueous CMP polishing compositions as in any one of items 1, 2, 3 or 4, above, wherein the aminosilane group is chosen from an aminosilane containing one or more tertiary amine group, such as N,N-

(diethylaminomethyl)triethoxysilane (DEAMS), or one or more secondary amine group, such as N-(2-aminoethyl)-3-aminopropyltrimethoxysilane (AEAPS) or N-aminoethyl-aminoethylaminopropyl trimethoxysilane (DETAPS), or one or more primary amine group, such as 3-aminopropyltriethoxysilane (APES) or 3-aminopropyltrimethoxysilane (APMS), preferably, an aminosilane containing one or more tertiary amine group.

6. In accordance with the aqueous CMP polishing compositions as in any one of items 1, 2, 3, 4 or 5, above, wherein the amount of aminosilane ranges from 0.0010 to 0.5 wt. %, or, preferably, from 0.003 to 0.1 wt. % or, more preferably, from 0.005 to 0.02 wt. %, based on the total silica solids in the aqueous CMP polishing compositions.

7. In accordance with the aqueous CMP polishing compositions as in any one of items 1, 2, 3, 4, 5 or 6, above, further comprising a compound containing one or more amine heterocycle carboxylic acids is chosen from N-containing heterocyclic monocarboxylic acids, or, more preferably, is chosen from nicotinic acid, picolinic acid, or isonicotinic acid.

8. In accordance with the aqueous chemical mechanical planarization (CMP) polishing compositions as in item 7, above, wherein the amount of amine heterocycle carboxylic acid ranges from 10 to 5000 ppm or, preferably, from 20 to 1000 ppm or, more preferably, 20 ppm to 700 ppm, based on the total silica solids in the aqueous CMP polishing composition.

9. In accordance with the aqueous chemical mechanical planarization (CMP) polishing compositions as in any one of items 1, 2, 3, 4, 5, 6, 7 or 8, above, wherein the weight average particle sizes (CPS) of the silica particles ranges from 10 nm to 200 nm, or, preferably, from 25 nm to 80 nm.

10. In accordance with the aqueous chemical mechanical planarization (CMP) polishing compositions as in any one of items 1 to 9, above, for use in polishing dielectrics or oxide containing substrates, wherein the compositions comprise substantially no oxidizer compound, such as hydrogen peroxide.

11. In accordance with the aqueous chemical mechanical planarization (CMP) polishing compositions as in any one of items 1 to 10, above, further comprising one or more compounds containing two quaternary ammonium groups, such as, for example, hexabutyl $C_1$-$C_8$ alkanediammonium dihydroxides or salts thereof, such as dihalides, or, preferably, N,N,N,N',N',N'-hexabutyl-1,4-butanediammonium dihydroxide (HBBAH).

12. In accordance with the aqueous chemical mechanical planarization (CMP) polishing compositions of the present invention as in item 11, above, wherein the amount of the compound containing two quaternary ammonium groups ranges from 1 to 2000 ppm or, preferably, from 5 to 500 ppm or, more preferably, 10 ppm to 200 ppm, based on the total silica solids in the aqueous CMP polishing composition.

13. In accordance with the aqueous CMP polishing compositions as set forth in any one of items 1 to 12 above, wherein the compositions further comprise one or more cationic copolymers, such as a cationic copolymer of any of a diallyldialkylamine salt, a diallylalkylamine salt, or a diallylamine salt and a nonionic monomer, such as sulfur dioxide.

14. In accordance with another aspect of the present invention methods of using aqueous CMP polishing compositions comprise polishing a substrate with a CMP polishing pad and an aqueous CMP polishing composition as set forth in any one of items 1 to 13, above.

15. In accordance with the methods of the present invention as set forth in item 14, above, wherein the substrate comprises both silicon dioxide or tetraethoxysilicate (TEOS) and silicon nitrides, as SiN or $Si_3N_4$ or their mixtures, and the polishing results in an oxide:nitride removal rate ratio of at least 8:1, for example, from 10:1 to 50:1 or, preferably, at least 10:1, for example, from 20:1 to 40:1.

16. In accordance with the methods of polishing a CMP substrate as in any one of items 14 or 15, above, wherein the polishing downforce ranges from 10.3 kPa (1.5 psi) to 41.5 kPa (6 psi) or, preferably, from 12 kPa (1.8 psi) to 36 kPa (5.2 psi).

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly)isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "amine heterocycle carboxylic acid" means any organic compound which contains at least one carboxyl group and at least one amine heterocycle containing group. Thus, an amine heterocycle carboxylic acid is not limited to those naturally occurring amino acids having an amine heterocycle containing group or just those amino acids that form peptide bonds. For example, pyridine carboxylic acids are amine heterocycle carboxylic acids that are not likely to form peptide bonds.

As used herein, the term "ASTM" refers to publications of ASTM International, West Conshohocken, Pa.

As used herein, the term "colloidally stable" means that a given composition does not gel or precipitate, and remains clear upon visible inspection after a given time and at a given temperature.

As used herein, the term "isolectric point" or "pI", for an amine carboxylic acid refers to the average of the $pKa_1$ and the $pka_2$ of the amine carboxylic acid, wherein the $pKa_1$ refers to the first or lowest pKa of a carboxyl group on the amine carboxylic acid and the $pKa_2$ refers to the last or highest pKa of amine group on the amine carboxylic acid. For example, of the pKa1 is 2.5 and the pKa2 is 6.5, then the isolectric point of the amine carboxylic acid is 4.5. Further, as used herein, the term "pI of the total abrasive" means a weighted average of the pI of each of the one or more dispersions of colloidal silica particles. Thus, if there is one such dispersion of colloidal silica particles, then the pI of the total abrasive equals the pI of that dispersion; if there is a 50/50 w/w mixture of two such dispersions and the pI of one such dispersion is 3.5 and the pI of the other such dispersion is 4.5, then the pI of the total abrasive is (3.5×0.5)+(4.5×0.5) or 4.0.

As used herein, the term "hard base" refers to metal hydroxides, including alkali(ne earth) metal hydroxides, such as NaOH, KOH, or $Ca(OH)_2$.

As used herein, the term "ISO" refers to publications of the International Organization for Standardization, Geneva, CH.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "silica particle solids" or "silica solids" means, for a given composition, the total amount of spherical silica particles, plus the total amount of elongated, bent or nodular silica particles, including anything with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "strong acid" refers to protic acids having a $pK_a$ of 2 or less, such as inorganic acids like sulfuric or nitric acid.

As used herein, the term "substantially no oxidizer compound" means there is no added oxidizer compound in a given composition and that the composition contains less than 500 ppm, or, preferably, less than 100 ppm of any oxidizer compound.

As used herein, the term "use conditions" means the temperature and pressure at which a given composition is used, including increases in temperature and pressure during or as a result of use.

As used herein, the term "weight fraction silica" means the total wt. % of silica, based on the total weight of the composition/100%. Thus, 30 wt. % silica equates to a weight fraction of 0.3.

As used herein, the term "wt. %" stands for weight percent.

As used herein, the term "zeta potential" refers to the charge of a given composition as measured by a Malvern Zetasizer instrument (Malvern Instruments, Malvern, UK). All zeta potential measurements were made on (diluted) slurry compositions as described in the examples, below. The reported value was taken from an averaged measurement of zeta values using >20 acquisitions taken by the instrument for each indicated composition.

The present inventors have discovered that amine heterocycle containing carboxylic acids play an important role in tailoring oxide:nitride selectivity in CMP polishing. Because the amine heterocycle carboxylic acid comprises a titrant which can be used to adjuct the pH of the CMP polishing compositions, the composition of the present invention exerts little negative influence on silica abrasive particle stability or its interaction with the substrate; further, the compositions of the present invention enable inhibition of nitride removal rate without impairing oxide, e.g. tetraethoxysilane (TEOS) removal rate. The aqueous CMP polishing compositions in accordance with the present invention provide a dielectric oxide:dielectric nitride substrate removal rate selectivity ratio of from 10:1 to 50:1, or, preferably, from 20:1 to 40:1. The selectivity ratio is even more improved at the preferred pH of 4 to 5 when compared to commonly used alkyl carboxylic acids and dicarboxylic acids, such as acetic acid, or succinic acid, or citric acid. Accordingly, the methods in accordance with the present invention enable to provision of the dielectric oxide:dielectric nitride substrate removal rate selectivity ratio of from 10:1 to 50:1, or, preferably, from 20:1 to 40:1.

The amine heterocycle carboxylic acids of the present invention preferably are monocarboxylic acids. Aqueous CMP polishing compositions with dicarboxylic acid additives have impaired oxide:nitride selectivity when tested alongside the compositions of the present invention.

In accordance with the present invention, suitable colloidal silica compositions may comprise a dispersion of silica made by conventional sol gel polymerization or by the suspension polymerization of water glass so as to produce a plurality of elongated, bent or nodular silica particles in a distribution or mixture that may include a plurality of spherical silica particles.

Suitable elongated, bent or nodular silica particles are made from suspension polymerization by hydrolytic condensation of silanols formed in a known manner from precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkylamines or KOH, preferably, tetramethylammonium hydroxide; the hydrolytic condensation process may incorporate one or more cationic nitrogen atoms into the elongated, bent or nodular silica particles. Preferably, the elongated, bent or nodular silica particles are cationic at a pH of 4.

Suitable bent or nodular silica particles are available from Fuso Chemical Co., Ltd., Osaka, JP (Fuso) under the tradenames HL-2, HL-3, HL-4, PL-2, PL-3 or BS-2 and BS-3 slurries. The HL and BS series particles from Fuso contain one or more nitrogen atoms which impart a cationic charge at pH 4.

To insure colloidal stability of the aqueous CMP polishing compositions of the present invention, the compositions have a pH ranging from 2.5 to 5.3 or, preferably, from 4 to 5. The compositions tend to lose their stability above the desired pH range.

In accordance with the compositions of the present invention, aminosilanes are used in amounts such that more aminosilane is used with smaller silica particles (that have more surface area) and less aminosilane is used with larger silica particles. Suitable amounts of the aminosilane range from 0.0020 to 0.25 wt. %, or, preferably, from 0.003 to 0.1 wt. % or, more preferably, from 0.003 to 0.02 wt. %, based on the total silica solids in the aqueous CMP polishing compositions.

Aminosilane (ammonium silane) compounds may at the pH of the compositions of the present invention physisorb onto silica particle surfaces due to electrostatic attraction with the particle surface. They can then react with the silica surface by a condensation reaction, forming Si—O—Si bonds. In general, at least 75 wt. % of any aminosilane compound will be bonded to the silica surface, i.e. not freely floating in the continuous aqueous phase.

The dispersions of colloidal silica particles in the CMP polishing compositions of the present invention have a positive zeta potential, or, if a mixture of two or more dispersions of colloidal silica particles, a positive average zeta potential. For controlling colloidal stability, the number of cationic nitrogen atoms in the aminosilane per unit surface area of the silica particles in the pH range of less than 5 should remain low and yet cause the silica particles to have a positive zeta potential. However, too many cationic nitrogen atoms per surface area of silica particles can lead to a loss in polishing ability of the slurry, as measured by removal rates of TEOS wafers. The number of cationic nitrogen atoms to a unit of silica surface area is also a function of the porosity, density, and silanol concentration of the silica particle surface; more aminosilane would be needed for more porous or less dense silica particles as well as for silica having more silanol groups on its surface. It is well known in the art that the silanol density for silica particles in water varies from 1.8 to 2 silanols/nm$^2$ of surface area to as much as 7 to 8 silanols/nm$^2$, based on surface areas as measured by BET measurement.

Aminosilanes can improve the colloidal stability of the compositions of the present invention relates; such stability can relate to the presence of positive charged atoms or cations. Tertiary and secondary aminosilanes having one amine group contribute one positive charge or cationic nitrogen atom per aminosilane molecule at the pH of the compositions of the present invention because the amino group is protonated. Bis(amino) silanes and aminosilanes containing two amine groups, such as N-(2-aminoethyl)-3-aminopropylsilanes contribute approximately 2 positive charges or cationic nitrogen atoms per aminosilane molecule at the pH of the compositions of the present invention.

Suitable aminosilanes for use in making an aminosilane group containing silica particle dispersions of the present invention are tertiary amine group and secondary amine group containing aminosilanes. The aminosilanes in the compositions of the present invention are present as hydrolyzed aqueous aminosilanes during initial mixing, but quickly become sorbed on the surface of the silica particles.

Suitable aminosilanes for use in the aqueous CMP polishing compositions of the present invention comprise an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AE-APS) or N-aminoethylaminoethylaminopropyl trimethoxysilane (DEAPS aka DETAPS), or one or more primary amine group, such as 3-aminopropyltriethoxysilane (APES) or 3-aminopropyltrimethoxysilane (APMS), preferably, an aminosilane containing one or more tertiary amine group.

In accordance with the hydrolyzed aqueous aminosilane of the present invention and methods for making the CMP polishing compositions containing them, an aqueous aminosilane composition is allowed to sit so as to hydrolyze any silicate bonds formed on storage. For aminosilanes containing one or more secondary amine groups, the pH of such aqueous aminosilanes is maintained at from 7 to 8 for from 5 to 600 minutes, such as for 5 to 120 minutes, before the pH is adjusted to from 3.5 to 5 with a strong acid. The tertiary amine group containing aminosilanes are more readily hydrolyzed at the desired pH range of the aqueous silica CMP polishing compositions of the present invention than are primary and secondary amine group containing aminosilanes. A small percentage of the aminosilanes may exist as short chain oligomers after the hydrolysis step.

As aminosilanes having one or more secondary amine groups are less preferred, the preferred method of making a hydrolyzed aqueous aminosilane comprises adjusting the pH of the aqueous aminosilane of the present invention having one or more tertiary amino group, to a pH of from 3.5 to 4.5 and allowing it to sit for from 5 to 600 minutes or from 5 to 120 minutes.

In accordance with the present invention, suitable amounts of aminosilanes may range from 0.0010 to 0.25 wt. %, or, preferably, from 0.003 to 0.1 wt. % or, more preferably, from 0.003 to 0.02 wt. %, based on the total silica solids in the aqueous CMP polishing compositions.

Preferably, in accordance with the present invention, the aqueous CMP polishing compositions comprising a compound containing two quaternary ammonium groups, such as N,N,N,N',N',N'-hexabutyl-1,4-butanediammonium dihydroxide (HBBAH). Sch compounds enhance the stability of the aqueous CMP polishing compositions for storage, shipment and heat aging while maintaining a high removal rate.

In accordance with the present invention, suitable compounds containing two quaternary ammonium groups may comprise hexabutyl $C_1$-$C_8$ alkanediammonium dihydroxides or salts thereof, such as dihalides, or, preferably, N,N,N,N',N',N'-hexabutyl-1,4-butanediammonium dihydroxide (HBBAH).

In accordance with the present invention, suitable amounts of the compound containing two quaternary ammonium groups ranges from 1 to 2000 ppm or, preferably, from 5 to 500 ppm or, more preferably, 10 ppm to 200 ppm, based on the total silica solids, in the composition. The amount should be sufficient to ensure a stabilizing effect. More of the compound containing two quaternary ammonium groups is needed to stabilize concentrates and compositions having a higher silica concentration and/or a lower aminosilane concentration. More is also need to stabilize smaller average size particles owing to their increased surface area and potential for oligomerization or gelling.

Preferably, to reduce dishing of the dielectric oxide during CMP polishing, the compositions of the present invention may further comprise a cationic polymer, such as a cationic copolymer, for example, a copolymer of an anionic monomer or repeating unit, such as sulfur dioxide, with any of a diallyldialkylamine salt having a cationic nitrogen, such as diallyldimethylammonium halide, a diallylamine salt having a cationic amine group, such as a diallylammonium halide, or a diallylalkylamine salt having a cationic amine group, such as a diallylalkylammonium salt, for example, a diallylalkylammonium halide, preferably, a diallylmonomethylammonium salt. Such a copolymer can aids in silicon oxide selectivity and in preventing dishing in polishing. Amounts of the cationic copolymer range up to 0.5 wt. %, based on the total weight of the composition. Too much of the cationic copolymer can passivate the dielectric or silica surface of the substrates. The cationic copolymer of the present invention may be made by addition polymerization in the presence of or the absence of an acid, as detailed, for example, in U.S. Pat. No. 9,006,383 B2 to Yusuke et al.

The aqueous chemical mechanical planarization (CMP) polishing compositions in accordance with the present invention find use in polishing dielectrics or oxide containing substrates, wherein the compositions comprise no oxidizer compound, such as peracids, peroxides, iron oxides or iodate salts.

Preferably, the aqueous CMP polishing compositions of the present invention can further comprise one or more surfactants having a hydrophobic alkyl or aryl-substituted alkyl (aralkyl) group chosen from an amine alkoxylate, a diamine alkoxylate, an ammonium alkoxylate, or mixtures thereof. Such surfactants can be (i) an amine or diamine alkoxylate having a $C_8$ to $C_{32}$ or, preferably, a $C_8$ to $C_{24}$ N-alkyl amine group a secondary amine, or a tertiary amine, preferably, a tertiary amine, (ii) an ammonium alkoxylate having a $C_8$ to $C_{32}$ or, preferably, a $C_8$ to $C_{24}$ N-alkyl ammonium group, or (iii) both (i) and (ii). More preferably, at least one of the surfactants has two N-alkoxy ether groups and, even more preferably, at least one (ii) ammonium alkoxylate comprises a $C_1$ to $C_6$ N-alkyl group. In the amine alkoxylates, diamine alkoxylates, ammonium alkoxylates, or all of them, the N-alkoxy ether group, N-ethoxy ether oligomer, or N-propoxy oligomer has from 2 to 50 ether repeating units or, preferably, from 4 to 24 ether repeating units. The amount of such one or more surfactants preferably ranges from 0.001 to 1 wt. % or, more preferably, from 0.0025 to 0.05 wt. %, as solids based on the total weight of the composition. When the surfactant is an ammonium alkoxylate or a mixture of surfactants containing an ammonium alkoxylate and an amine alkoxylate, the amount of the one or more ammonium alkoxylates preferably ranges from 0.0005 to 1 wt. % or, more preferably, from 0.0015 to 0.05 wt. %, as solids based on the total weight of the composition.

The CMP polishing in accordance with the present invention comprises a conventional CMP polishing method. The CMP polishing comprises: Providing a CMP polishing apparatus having a platen or table; providing the substrate to be polished, such as a silicon or polysilicon substrate on which is deposited a layer of a dielectric, such as silicon dioxide, and, preferably, on which is also deposited a layer of silicon nitride; providing a CMP polishing pad, such as a polyurethane foam pad, having a polishing surface; installing onto the platen or table the CMP polishing pad; providing the aqueous CMP polishing composition of the present invention at an interface between a polishing surface of the CMP polishing pad and the substrate; and, creating dynamic contact between the CMP polishing pad surface and the substrate until the layer of polysilicon, preferably and any silicon nitride, is exposed but not substantially removed, preferably, such that the dielectric or silicon oxide remaining in any low areas or trenches is approximately level with the edges of the polysilicon and any silicon nitride.

In accordance with the methods of the present invention, the methods comprise CMP polishing wherein the creating dynamic contact between the CMP polishing pad surface and the substrate can be by rotating the substrate, rotating the CMP polishing pad having the polishing layer, or rotating both.

In accordance with the methods of the present invention, the methods comprise: CMP polishing with a CMP polishing pad and, separately or at the same time, conditioning the polishing surface of the CMP polishing pad with a conditioning pad so that it has a surface microtexture.

In accordance with the present invention, the substrate comprises silicon nitrides, as SiN or $Si_3N_4$, as well as silicon dioxide or tetraethyl orthosilicate (TEOS) and the polishing results in an oxide:nitride removal rate ratio of at least 10:1, for example, from 10:1 to 50:1 or, preferably, from 20:1 to 40:1.

Desirably, the CMP polishing of the present invention is carried out in STI or ILD processing with the CMP polishing composition of the invention, preferably such that the polysilicon and any silicon nitride is not substantially removed and the silicon dioxide is adequately planarized without excessive erosion or dishing of dielectric or silicon dioxide within the trenches or any other low areas.

In use, STI processing of a wafer substrate involves providing a silicon substrate on which is deposited a layer of silicon nitride. Following photolithography, trenches are etched onto the substrate comprising an overlying layer of silicon nitride, and an excess of dielectric, for example, silicon dioxide, is deposited thereon. The substrate is then subjected to planarization until the surface layer of silicon nitride is exposed but not substantially removed, such that the dielectric or silicon oxide remaining in the trenches is approximately level with the edges of the silicon nitride.

In use, ILD or bulk dielectric processing of a wafer substrate involves providing a feature containing silicon substrate having doped silicon active features with low areas between them and silicon nitride trenches therein and on which is deposited a layer of a filling layer of dielectric, such as silicon dioxide or TEOS. The substrate is then subjected to planarization until the surface layer of silicon and silicon nitride is exposed but not substantially removed, such that the dielectric or silicon oxide remaining in the low areas and trenches is approximately level with the edges of the silicon features and the silicon nitride.

EXAMPLES

The following examples illustrate the various features of the present invention.

In the Examples that follow, unless otherwise indicated, conditions of temperature and pressure are ambient temperature and standard pressure.

The following materials were used in the Examples that follow:

HBBAH=N,N,N,N',N',N'-hexabutyl-1,4-butanediammonium dihydroxide, 98 wt. % (Sachem, Austin, Tex.).

AEAPS=N-(2-aminoethyl)-3-aminopropyltrimethoxysilane, 98% (Gelest Inc., Morrisville, Pa.);

DEAMS=(N,N-diethylaminomethyl)triethoxysilane, 98%, (Gelest Inc.).

Diamine alkoxylate: Ethoduomeen™ T-25 ethoxylated (15) N-tallow-1,3-diaminopropane surfactant (CAS: 61790-85-0, Akzo Nobel).

The various silica particles used in the Examples are listed in Table A, below.

TABLE A

| Silica particles | | | | |
|---|---|---|---|---|
| Aqueous Silica Slurry | Source | pH | Nominal $SSA^2$ ($m^2/g$) | Concentration[4] (wt. % solids) | Particle size (CPS, nm) |
| Slurry A | Klebosol™,[1] 1598-B25 | 7.7 | 110 | 30 | 38 |
| Slurry B | BS-3[3] | 7.3 | — | 20 | 53 |

[1] Merck KgAA, Darmstadt, Germany. All particles are spherical and produced from sodium silicate raw materials.
[2] Reported specific surface areas (SSA) from Merck KgAA for each product, not lot specific;
[3] Elongated silica particles having a cationic nitrogen made from an alkoxyalkyl amine catalyst, Fuso Chemical Co., Ltd., Osaka, JP;
[4] As supplied.

The following abbreviations were used in the Examples that follow:

POU: Point of use; RR: Removal rate; SA: Surface Area; SSA: Specific surface area.

The pI of many amine carboxylic acids is shown in Table B, below. In Table B, below, N refers to an amine.

TABLE B

| Pkas And Isoelectric Points Of Amine carboxylic acids | | | | | | |
|---|---|---|---|---|---|---|
| Amine heterocyle or other carboxylic acid | pKa1 | pKa2 | pKa3 | pKa4 | pKa5 | pI |
| nicotinic acid | 2.09 (N) | 4.85 (COOH) | | | | 3.425 |
| picolinic acid | 1.07 | 5.25 | | | | 3.16 |

TABLE B-continued

Pkas And Isoelectric Points Of Amine carboxylic acids

| Amine heterocyle or other carboxylic acid | pKa1 | pKa2 | pKa3 | pKa4 | pKa5 | pI |
|---|---|---|---|---|---|---|
| succinic acid | (N) 4.19 | (COOH) 5.48 | | | | 4.84 |
| 1,2,4,5-benzenetetra-carboxylic acid | (COOH) 1.92 | (COOH) 2.87 | 4.49 (COOH) | 5.63 (COOH) | | 3.78 |
| diethylenetriamine pentaacetic acid | 1.5 (COOH) | 2.6 (COOH) | 4.3 (COOH) | 8.6 (N) | 10.6 (N) | 6.05 |
| ethylenediamine disuccinic acid | 3.03 (COOH) | 3.92 (COOH) | 7.01 (N) | 9.7 (N) | | 6.37 |
| adipic acid | 4.43 (COOH) | 5.41 (COOH) | | | | 4.92 |
| heptanoic acid | 4.89 (COOH) | | | | | 4.89 |
| 2,3-pyridine dicarboxylic acid | 0.29 (N) | 2.43 (COOH) | 5.48 (COOH) | | | 2.88 |
| 2,6-pyridine dicarboxylic acid | 0.4 (N) | 2.16 (COOH) | 4.38 (COOH) | | | 2.39 |

Isoelectric Points of Amine Carboxylic Acids:

The isoelectric point or pI of an amine carboxylic acid is the pH at which the amine carboxylic acid does not migrate in an electric field or electrophoretic medium. Amine carboxylic acids having neutral side chains are characterized by two pKas: pKa1 for the carboxylic acid and pKa2 for the amine. The pI will be halfway between, or the average of, these two pKas, i.e. $pI=\frac{1}{2}(pKa_1+pKa_2)$. At a pH below pKa1, the amine carboxylic acid will have an overall positive charge and at a pH above pKa, the amine carboxylic acid will have an overall negative charge. For the simplest amine carboxylic acid, glycine, pKa1=2.34 and pKa2=9.6, pI=5.97. Acidic amine carboxylic acids have an acidic side chain. The pI will be at a lower pH because the acidic side chain introduces an extra negative charge. For example, for aspartic acid there are two acid pKas, ($pKa_1$ and $pKa_2$) and one amine pKa, $pKa_3$. The pI is halfway between these two values, i.e. $pI=\frac{1}{2}(pKa_1+pKa_3)$, so pI=2.77. Basic amine carboxylic acids have a pI at a higher pH because the basic side chain introduces an extra positive charge. For example, for histidine, pI is halfway between the lowest pKa, that of the carboxylic acid hydrogen and the highest pKa, that of the ammonia hydrogen two values $pI=\frac{1}{2}(pKa_2+pKa_3)$, so pI=7.59.

Formulation Examples

Unless otherwise indicated in the following examples, each slurry was formulated from a 3:1 mixture, by weight, as solids, of the elongated, bent or nodular silica particles in Slurry B and the silica particles of Slurry A, each from Table A, above, as a 15 wt. % solids slurry composition. The compositions at POU comprise the indicated amount, e.g. of 50 ppm to 500 ppm, of the indicated acid or amine heterocycle carboxylic acid, as solids, based on the total weight of the composition; about 0.08 wt. % solids of DEAMS aminosilane as a solution of in water at pH~7.5 was added to the indicated silica particle slurry composition to form amine-treated colloidal silica particles. The pH of the slurry was maintained at ~7.5 for 1 hr. The resulting composition comprises about 90 wt. % of silica particles containing the aminosilane on the particle. The compositions were combined with the 0.00625 wt. %, as solids, of Diquat and, unless otherwise indicated, were aged at room temperature. The silica slurry composition was were adjusted to the indicated pH using succinic acid as reference.

If only a single Slurry A or Slurry B is indicated in the following examples, then it is used starting as a 15 wt. % solids composition and the indicated silica particle slurry was combined with DEAMS, as above.

The above formulation was diluted to 2 weight % solids and combined with the indicated surfactants and any other indicated materials to give aqueous CMP polishing compositions, as shown in Tables C to E, below.

TABLE C

CMP Polishing Compositions
(All proportion units are pbw, as solids)

| Example | Aminosilane group containing colloidal silica* | Final pH | pH Titrant | Wt. % Titrant |
|---|---|---|---|---|
| 1 (Comparative) | 2 | 4.5 | Succinic Acid | 0.012% |
| 2 (Comparative) | 2 | 4.5 | 1,2,4,5-Benzenetetracar-boxylic acid | 0.008% |
| 3 (Comparative) | 2 | 4.5 | Diethylene-triamine pentaacedi acid | 0.010% |
| 4 (Comparative) | 2 | 4.5 | Ethylenedi-amine-N,N'-disuccinic acid | 0.010% |

*3:1 solids wt. Slurry B to Slurry A.

The following test methods were used in the Examples that follow:

pH at POU:

The pH at point of use (pH at POU) was that measured during removal rate testing after dilution of the indicated concentrate compositions with water to the indicated solids content.

Removal Rate:

Removal rate testing from polishing on the indicated substrate was performed using an Applied Materials Reflexion™ 300 mm polishing machine or "Reflexion RR" (Applied Materials, Santa Clara, Calif.), as indicated, at the indicated downforce and table and carrier revolution rates (rpm), and with the indicated CMP polishing pad and abrasive slurry at a given abrasive slurry flow rate 300 ml/min. A Saesol 8031C1 diamond pad conditioner (Saesol Diamond Ind. co., ltd., Korea) was used to condition the polishing pad. The CMP polishing pad was broken in with the pad conditioner using a down force of 6.35 kg (14.0 lb) for 20 minutes and was then further conditioned prior to polishing using a down force of 4.1 kg (9 lb) for 10 minutes. The CMP polishing pad was further conditioned in situ during polishing at 10 sweeps/min from the center of the polishing pad with a down force of 4.1 kg (9 lb). The removal rates were determined by measuring the film thickness before and after polishing using a KLA-Tencor F5X metrology tool (KLA Tencor, Milpitas, Calif.) using a 49 point spiral scan with a 3 mm edge exclusion.

Z-Average Particle Size:

The Z-Average particle size of the indicated composition was measured by Dynamic Light Scattering (DLS) using a Malvern Zetasizer device (Malvern Instruments, Malvern, UK) calibrated per manufacturers recommendations. The z-Avg particle size is the intensity-weighted harmonic mean size, which is a diameter, as calculated by an ISO method (ISO13321:1996 or its newer pendant ISO22412:2008). Measurements of particle size were done on diluted particle samples at pHs as described in each example.

Zeta Potential:

Zeta potential of the indicated compositions was measured by a Malvern Zetasizer instrument in the manner defined above. Measurements of zeta potential were done on compositions diluted to 2% w/w silica with a pH 4.5 solution, the compositions at or near a pH of 4.5.

Removal Rate Testing:

The slurry concentrates were diluted to 2% w/w in water for removal rate testing with no subsequent pH adjustment. Unless otherwise indicated an AMAT Reflexion™ LK polisher (Applied Materials, Santa Clara, Calif.) at a downforce of 6.9 kPa (1 psi) and 20.7 kPa (3 psi) with a table speed of 93 rpm, and a substrate carrier speed of 87 rpm. To test performance, TEOS/SiN/Poly-Si wafers were polished at a flow rate of 300 mL/min. Unless otherwise indicated, an IC1000™ urethane pad 80 mils thick with a shore D hardness of 57 (The Dow Chemical Company, Midland, Mich., (Dow)) having a K7+R32 groove pattern was used.

Example 1: Effects of Carboxylate on a Variety of Carboxylic Acid

Removal rate testing of the slurry compositions indicated in Table C, above, is indicated in Table 1, below.

TABLE 1

Removal Rate Testing

| | 20.7 kPa | | |
|---|---|---|---|
| Example | TEOS RR | SiN RR | Ox: Nit Selectivity |
| 1 (Comparative) | 3104 | 107 | 29 |
| 2 (Comparative) | 2822 | 445 | 6 |
| 3 (Comparative) | 2386 | 144 | 17 |
| 4 (Comparative) | 2341 | 158 | 15 |

As shown in above Table 1, none of the selected oligo-carboxylic acids yielded an improved selectivity compared to reference succinic acid.

Example 2: Effects of Various Acidic Compounds

Removal rate testing of the Compositions indicated in Table C, below, is indicated in Table 2, below. Formulations were made in the same manner as indicated above with a 3:1 solids weight blend of Slurry B:Slurry A. Removal rate was tested as indicated, above; and downforce in kPa is indicated in Table 2, below.

TABLE D

More Formulations
(All proportion units are pbw, as solids)

| Example | Amine-surface treated colloidal silica | Final pH | pH Titrant | Wt. % Titrant |
|---|---|---|---|---|
| 5 (Comparative) | 2 | 4 | Succinic Acid | 0.02% |
| 6 (Comparative) | 2 | 4 | Adipic Acid | 0.022% |
| 7 (Inventive) | 2 | 4 | Nicotinic Acid | 0.03% |
| 8 (Comparative) | 2 | 4 | Heptanoic Acid | 0.03% |

TABLE 2

Removal Rate Testing

| | 6.9 kPa | | | 20.7 kPa | | |
|---|---|---|---|---|---|---|
| Example | TEOS RR | SiN RR | TEOS:SiN Selectivity | TEOS RR | SiN RR | TEOS:SiN Selectivity |
| 5 (Comparative) | 1186 | 25 | 47 | 3221 | 114 | 28 |
| 6 (Comparative) | 1077 | 21 | 51 | 3020 | 103 | 29 |
| 7 (Inventive) | 1078 | 17 | 64 | 3027 | 77 | 39 |
| 8 (Comparative) | 1137 | 24 | 48 | 2920 | 91 | 32 |

As shown in Table 2, above, the inventive aqueous CMP polishing compositions of Example 7 having nicotinic acid as the amine heterocycle carboxylic acid yield about a ~35% selectivity improvement, suppressing nitride removal Example 3: More CMP Polishing Formulations The formulations indicated in Table E, below, were tested as indicated above for removal rate; and the downforce in kPa and results are indicated in Table 3, below.

TABLE E

More Formulations
(All proportion units are pbw, as solids)

| Example | Amine-surface treated silica | Diamine alkoxylate | Final pH | pH Titrant | Wt. % Titrant |
|---|---|---|---|---|---|
| 9 (Comparative) | 2 | | 4.6 | Succinic Acid | 0.01% |
| 10 (Comparative) | 2 | 0.005 | 4.6 | Succinic Acid | 0.016% |
| 11 (Inventive) | 2 | 0.005 | 4.6 | Picolinic acid | 0.021% |
| 12 (Comparative) | 2 | 0.005 | 4.6 | 2,3-Pyridinedicarboxylic acid | 0.009% |
| 13 (Comparative) | 2 | 0.005 | 4.6 | 2,6-Pyridinedicarboxylic acid | 0.009% |

TABLE 3

| | Removal Rate Performance | | |
| --- | --- | --- | --- |
| | 20.7 kPa | | |
| Example | TEOS RR | SiN RR | Selectivity |
| 9 (Comparative) | 3233 | 154 | 21 |
| 10 (Comparative) | 3170 | 116 | 27 |
| 11 (Inventive) | 3164 | 86 | 37 |
| 12 (Comparative) | 3051 | 216 | 14 |
| 13 (Comparative) | 3079 | 171 | 18 |

As shown in Table 3, above, the slurry composition of Example 11 that contains the amine heterocycle carboxylic acid facilitates an improvement in oxide:nitride selectivity. In comparison to picolinic acid (pyridine monocarboxylic acid), the two tested pyridine dicarboxylic acids in the Comparative Examples 12 and 13 have caused a nitride removal rate increase, instead of suppressing it.

We claim:

1. An aqueous chemical mechanical planarization polishing composition comprising an abrasive of one or more dispersions of colloidal silica particles having one or more aminosilane compounds bonded to a surface of the colloidal silica particles, wherein the one or more dispersions of a plurality of colloidal silica particles has a zeta potential of from +5 to +50 mV at the pH of the composition, and at least one amine heterocycle carboxylic acid having an isolectric point (pI) from 3 to 4.5, a cationic polymer comprising a diallyldialkylamine salt having a cationic nitrogen, a diallylamine salt having a cationic amine group or a diallylalkylamine salt having a cationic amine group, and one or more compounds containing two quaternary ammonium groups, the composition has a pH of from 2.5 to 5.3, and, further wherein, the amount of the abrasive particles as solids, ranges from 0.01 to 20 wt. %, based on the total weight of the composition, and the composition is free of oxidizer compounds.

2. The aqueous chemical mechanical planarization polishing composition as claimed in claim 1, wherein at least one of the dispersions of colloidal silica particles comprises elongated, bent or nodular colloidal silica particles or their mixture with one or more dispersions of spherical colloidal silica particles.

3. The aqueous chemical mechanical planarization polishing composition as claimed in claim 2, wherein the abrasive comprises a mixture of a dispersion of a plurality of elongated, bent or nodular colloidal silica particles which contain a cationic nitrogen atom, or a mixture thereof with a dispersion of a plurality of spherical colloidal silica particles, wherein the amount of the dispersion of the elongated, bent or nodular colloidal silica particles ranges from 50 to 99.9 wt. %, based on the total solids weight of the abrasive.

4. The aqueous chemical mechanical planarization polishing composition as claimed in claim 1, wherein the one or more aminosaline compounds are chosen from an aminosilane containing one or more tertiary amine groups, or one or more secondary amine groups, or one or more primary amine groups.

5. The aqueous chemical mechanical planarization polishing composition as claimed in claim 4, wherein the amount of the aminosaline compounds range from 0.0010 to 0.5 wt. %, based on the total silica solids in the aqueous chemical mechanical planarization polishing compositions.

6. The aqueous chemical mechanical planarization polishing composition as claimed in claim 1, wherein the compound containing one or more amine heterocycle carboxylic acids is chosen from N-containing heterocyclic monocarboxylic acids.

7. The aqueous chemical mechanical planarization polishing composition as claimed in claim 6, wherein the amine heterocycle carboxylic acid is chosen from nicotinic acid, picolinic acid, or isonicotinic acid.

8. The aqueous chemical mechanical planarization polishing composition as claimed in claim 1, wherein the amount of amine heterocycle carboxylic acid ranges from 10 to 5000 ppm based on the total silica solids in the aqueous chemical mechanical planarization polishing composition.

* * * * *